United States Patent
Hawryluk et al.

[11] Patent Number: 5,176,970
[45] Date of Patent: Jan. 5, 1993

[54] VIRTUALLY DISTORTION-FREE IMAGING SYSTEM FOR LARGE FIELD, HIGH RESOLUTION LITHOGRAPHY

[75] Inventors: Andrew M. Hawryluk, Modesto; Natale M. Ceglio, Livermore, both of Calif.

[73] Assignee: The United States of America as represented by the United States Department of Energy, Washington, D.C.

[21] Appl. No.: 597,968

[22] Filed: Oct. 12, 1990

[51] Int. Cl.⁵ .................... G03B 27/32; G03B 27/68
[52] U.S. Cl. .................... 430/5; 430/394; 430/396; 355/47; 355/49; 355/52; 355/66
[58] Field of Search .................... 430/5, 394, 396; 355/47, 49, 52, 66

[56] References Cited

U.S. PATENT DOCUMENTS 4,166,694 9/1979 Horning et al. .................... 355/47
4,198,147 4/1980 Alasia .................... 355/52

FOREIGN PATENT DOCUMENTS 56-69634 6/1981 Japan .................... 430/5

Primary Examiner—Marion E. McCamish
Assistant Examiner—Kathleen Duda
Attorney, Agent, or Firm—Miguel A. Valdes; Henry P. Sartorio; William R. Moser

[57] ABSTRACT

Virtually distortion free large field high resolution imaging is performed using an imaging system which contains large field distortion or field curvature. A reticle is imaged in one direction through the optical system to form an encoded mask. The encoded mask is then imaged back through the imaging system onto a wafer positioned at the reticle position.

10 Claims, 1 Drawing Sheet

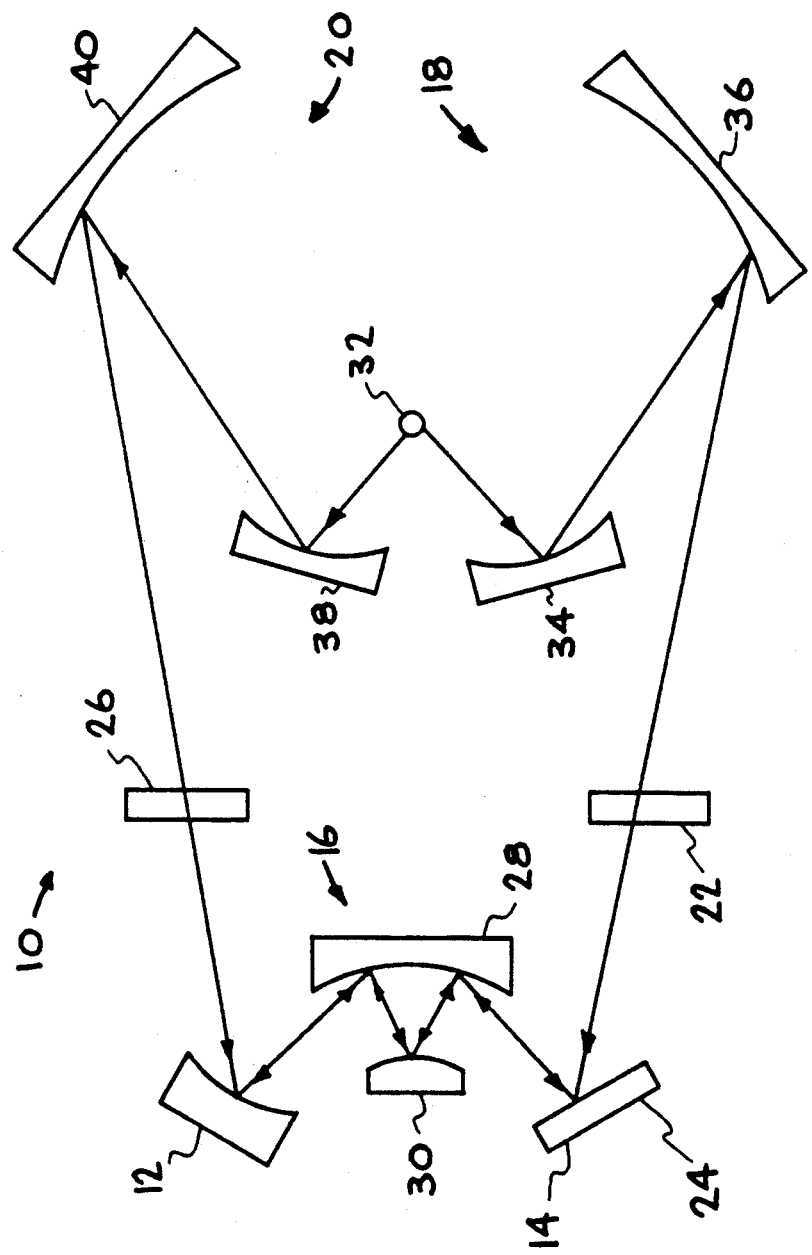

VIRTUALLY DISTORTION-FREE IMAGING SYSTEM FOR LARGE FIELD, HIGH RESOLUTION LITHOGRAPHY

The United States Government has rights in this invention pursuant to Contract No. W-7405-ENG-48 between the U.S Department of Energy and the University of California, for the operation of Lawrence Livermore National Laboratory.

BACKGROUND OF THE INVENTION

The invention relates to a simple projection imaging technique and apparatus, suitable for use with all forms of radiation such as visible, deep ultraviolet (UV) and x-rays, and particularly suitable for the replication (i.e., "lithography") of high density integrated circuit Patterns. The invention particularly relates to reduction or elimination of distortion problems in large field, high resolution lithography.

A number of different lithographic techniques are presently used for semiconductor microcircuit manufacturing. For example, visible and UV radiation are used in steppers to transfer a pattern from a master reticle to a wafer. This process uses projection optics and often demagnifies the image of the master pattern onto the wafer. To obtain a large, nearly distortion-free image field (the maximum allowable distortion in the image is typically required to be less than one tenth of the minimum linewidth in the entire field) with high spatial resolution, complex imaging systems are needed. These systems often use more than two optical elements and more than one aspheric optical element. Current commercial systems have a spatial resolution (i.e., can image a minimum linewidth) of approximately 0.5 microns and expose fields of approximately 25 mm in diameter. Due to fundamental physical constraints, this process operating at wavelengths greater than 190 nm will be unable to produce circuits with minimum feature sizes much smaller than approximately 0.2 microns.

In proximity print x-ray lithography (PPXRL), e.g., as described by A. Heuberger, J. Vac. Sci. Tech., B6, 107 (1988), a mask and wafer are placed in "near contact" to one another and the pattern on the mask is replicated onto the wafer by "shadow-casting". The mask is fabricated on a thin (less than 5 micron thick) membrane, is difficult to manufacture and is subject to distortion. Because of diffraction, PPXRL may not be able to achieve very high resolution (i.e., PPXRL may be limited to linewidths greater than 0.2 micron).

Soft x-ray projection lithography (SXPL), e.g., as described by A. M. Hawryluk and L. G. Seppala, J. Vac. Sci Tech., B6, 2162 (1988) and in U.S. patent application Ser. No. 308,332 filed Feb. 9, 1989 by A. M. Hawryluk and L. G. Seppala, has been shown to be capable of very high resolution (e.g., minimum feature size down to 0.05 microns or less), but requires a totally reflective imaging system. A reflective imaging system requires a multi-element, aspheric optical imaging system to achieve large flat fields (greater than 25 mm in diameter) with low distortion. This optical system requires very precise components which have yet to be developed. An alternative to this complex reflective imaging system utilizes an imaging system with all spherical reflective components and a curved reflecting mask. The advantage of this system is the ease of fabrication of spherical optics (relative to aspherical optics), but the disadvantage is the introduction of field curvature and distortion to the imaging system. Field curvature in the spherical imaging system can be eliminated with the appropriate mask curvature, and field distortion can be eliminated by patterning the curved mask in a manner that exactly compensates the distortion in the imaging system. For this approach to work, precise spherical optical imaging elements and apriori knowledge of the field distortion are required. In addition, mask patterning, repair and inspection techniques on curved substrates have not yet been demonstrated.

Conventional microcircuit mass production techniques are used to image or shadow-cast a master pattern (the reticle) onto a wafer. The process takes a precise, flat reticle and transports the image through a precise optical system (i.e., the optical transport system is nearly distortion free) to produce the desired pattern on the flat wafer. The requirement that the optical transport system be nearly distortion free and have a flat field (at both the reticle and the wafer) greatly increases the complexity of conventional lithographic tools.

SUMMARY OF THE INVENTION

Accordingly it is an object of the invention to provide method and apparatus for substantially distortion free lithography.

It is also an object of the invention to provide virtually distortion free imaging without requiring the imaging optics to be distortion free.

It is another object of the invention to perform distortion free lithography utilizing imaging optics with little or no coma, astigmatism or spherical aberrations but which may contain large field distortion or field curvature.

It is a further object of the invention to provide virtually distortion free, large field, high resolution imaging.

The invention is a lithography system, including method and apparatus, which corrects for its own distortion and produces a virtually distortion-free replication of an original reticle on a wafer. This Distortion Free Lithography (DFL) uses relatively simple reflection optics. In principle, a DFL system based on transmission optics can also be designed. The DFL based on reflection optics may be used with any radiation for which mirrors exist (i.e., soft x-rays, through deep UV, visible, infrared, etc.), and can be used to expose large fields (greater than 25 mm diameter) with very high resolution. Because it is a reflection system, the DFL system is achromatic and provides flexibility for the use of multiple wavelengths for different processes. For example, mask to wafer alignment can be accomplished at one wavelength, whereas, lithographic exposure can be at a second wavelength.

In the DFL according to the invention an encoding technique is used to fabricate an intermediate mask (the "encoded mask") from the original reticle. This encoded mask records the original reticle pattern as well as all the optical distortion produced by the imaging system. The encoded mask is then processed into a patterned reflecting mask. The patterned reflecting encoded mask is placed back into the imaging system and is imaged back ("played backwards") through the imaging system over the same path in the reverse direction from that used for encoding the mask to produce low distortion or distortion free images on the wafer.

BRIEF DESCRIPTION OF THE DRAWINGS

In the accompanying drawings:

The FIGURE is a schematic view of a virtually distortion-free imaging system for lithography.

DETAILED DESCRIPTION OF THE PREFERRED EMBODIMENTS

The method and apparatus according to the invention for producing substantially distortion free replication of an original mask (reticle) on a wafer by self-correction of distortion produced by the imaging optics is illustrated in the FIGURE. An encoding and replication system 10 is used to make an encoded mask 12 from the original reticle 14. The encoding and replication system 10 is formed of an imaging means or system (imaging optics) 16 with two condenser systems 18, 20. A variety of different imaging means 16 can be used in the encoding process, but it is preferable that the imaging optics have insignificant coma, astigmatism or spherical aberrations. However, large field distortion or field curvature would be permissible. The imaging means can be magnifying or demagnifying, or a 1:1 imaging system. As shown, imaging means 16 is formed of a pair of spaced aligned reflective elements 28, 30 (element 28 is a concave reflector and element 30 is a convex reflector).

The first step of the process is to make the encoded version of the original reticle 14. The prepatterned pre-encoded mask 12 is reflective at the wavelength used (i.e., a mirror), and is coated with a radiation sensitive material, such as photoresist. The reticle 14 is placed in alignment with the imaging optics 16 and shutter 22 is opened. Radiation from source 32 passes through condenser system 18 which is formed of a pair of spaced aligned reflectors 34, 36 and directed through shutter 22 onto reticle 14. Radiation reflected from reticle 14 passes through imaging means 16 onto prepatterned encoded mask 12. The image of the reticle 14 is recorded on the photoresist coated prepatterned encoded mask 12. This image will include the distortion of the optical imaging means 16. For flat field to flat field imaging systems, the encoded mask will be flat. For flat field to curved field imaging systems, the encoded mask will be appropriately curved to record the focused image of the reticle.

The second step of the process is to pattern the reflecting encoded mask 12. This is generally done by transferring the pattern recorded in the photoresist into or onto the reflecting encoded mask. There are a number of different techniques that can be used for this process, including etching, metalization, etc. This produces a patterned, reflecting encoded mask.

The third step of the process is to image the encoded mask 12 onto the wafer 24. The encoded mask 12 is placed back in its original precise position in alignment with imaging means 16 (after the processing of step two, above). The reticle 14 is removed from the imaging system and is replaced with a flat wafer 24 in the same precise position. The encoded mask 12 is now illuminated by opening shutter 26. The radiation from source 32 passes through condenser system 20 which is formed of a pair of spaced reflective elements 38, 40, and through open shutter 26 onto encoded mask 12 and back through imaging means 16 onto wafer 24. The pattern from the encoded mask 12 is thus imaged onto the wafer 24. The third step is performed over the identical imaging path through imaging optics 16 between reticle 14/wafer 24 and mask 12, as in the first step, but in the reverse direction. The illumination on the encoded mask 12 is arranged to be a replica (in the reverse direction) of that which would be reflected off the encoded mask in the first step, if it were only reflecting and not coated with photoresist, so that by optical reversibility, the pattern on the wafer 24 is identical to the original pattern on the reticle 14 without the field distortion normally associated with the optical imaging means 16. The normal field distortion is eliminated because the encoded mask 12 was recorded through the optical system in one direction and "played-back" through the optical system along the identical path in the opposite direction. Once the encoded mask 12 is fabricated, the reticle 14 need never be placed back into the optical encoding and replication system 10 (except perhaps to verify alignment). The encoded mask 12 now functions as the reticle 14 in a typical lithographic tool and can be used any number of times.

The invention can be carried out using radiation of virtually any wavelength, including soft x-rays, ultraviolet, visible and infrared, by using a suitable source and optical components.

The invention thus produces distortion-free replications of a reticle using an imaging system which can have field curvature, distortion, and minimal astigmatism.

The features and advantages of the system according to the invention include the following:

1. The optical encoding technique produces virtually distortion free replications of an original pattern (the reticle) over a large field of view.

2. The optical encoding technique produces high resolution replications.

3. The optical encoding technique may use reflective or transmissive optics.

4. The optical encoding technique can be used over any wavelength range where optics exist.

5. The optical encoding technique can use simple imaging systems with large distortion (distortion much greater than a minimum linewidth) and still produce distortion free replications of the reticle.

6. The optical encoding technique can use simple imaging systems with large field curvature (field curvature much greater than the depth of focus of the imaging system) and still produce distortion free replications of the reticle.

7. The reflective optical encoding technique is achromatic.

8. The optical encoding technique can be used with a magnifying, demagnifying, or 1:1 imaging system.

9. The encoded mask can be either flat or curved.

10. The encoded mask can be reused many times

11. The optical imaging system can use two or more, spherical or aspherical mirrors.

Changes and modifications in the specifically described embodiments can be carried out without departing from the scope of the invention which is intended to be limited only by the scope of the appended claims.

We claim:

1. A method for substantially distortion-free imaging of a reticle onto a wafer, comprising:
    imaging the reticle onto an encodable mask through a distortion producing imaging system in one direction;
    patterning the reticle image onto the encodable mask to form an encoded mask;
    replacing the reticle with a wafer at the same position;

imaging the encoded mask back through the distortion producing imaging system in the opposite direction onto the wafer.

2. The method of claim 1 further comprising forming the imaging system with substantially no coma, astigmatism and spherical aberrations.

3. The method of claim 1 wherein the imaging system has substantial field distortion and/or field curvature.

4. The method of claim 1 wherein the step of imaging the reticle onto an encodable mask comprises forming a prepatterned pre-encoded reflective mask, coating the reflective mask with photoresist, and directing radiation reflected from the reticle through the imaging system and onto the photoresist coated reflective mask to produce a reticle image on the photoresist.

5. The method of claim 4 wherein the step of patterning the encodable mask comprises transferring the reticle image from the photoresist to the reflecting mask.

6. The method of claim 5 wherein the step of imaging the encoded mask onto the wafer comprises directing radiation reflected from the encoded mask back through the imaging system along the same path but in the opposite direction as the direction used to encode the mask.

7. The method of claim 1 wherein the encoded mask is flat for flat field to flat field imaging systems.

8. The method of claim 1 wherein the encoded mask is curved for flat field to curved field imaging systems.

9. The method of claim 1 further comprising imaging the reticle over a wide field of view.

10. The method of claim 1 further comprising selecting a high resolution reticle.

* * * * *